(12) United States Patent
Koyama (10) Patent No.: US 7,385,225 B2
(45) Date of Patent: Jun. 10, 2008

(54) SURFACE EMITTING TYPE DEVICE, AND METHOD FOR MANUFACTURING THE SAME

(75) Inventor: Tomoko Koyama, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 102 days.

(21) Appl. No.: 11/297,400

(22) Filed: Dec. 9, 2005

(65) Prior Publication Data

US 2006/0175617 A1    Aug. 10, 2006

(30) Foreign Application Priority Data

Feb. 4, 2005   (JP)   ............................. 2005-029232

(51) Int. Cl.
 *H01L 27/15*    (2006.01)
(52) U.S. Cl. .................. 257/79; 257/99; 257/E33.047; 372/43.01; 372/46.01
(58) Field of Classification Search ................... 257/79
 See application file for complete search history.

(56) References Cited

U.S. PATENT DOCUMENTS 4,954,971 A * 9/1990 Opschoor et al. ........ 372/50.12

2001/0032984 A1* 10/2001 Uchida ........................ 257/84
2005/0271107 A1  12/2005 Murakami et al.
2006/0192088 A1*  8/2006 Koyama ................. 250/214 R

FOREIGN PATENT DOCUMENTS

JP   A 2004-006548   1/2004
JP   A 2005-353647   12/2005

* cited by examiner

*Primary Examiner*—Tu-Tu V Ho
(74) *Attorney, Agent, or Firm*—Oliff & Berridge, PLC (57) ABSTRACT

A surface-emitting type device includes a rectification section including a substrate and a first semiconductor layer formed above the substrate, and an emission section including a second semiconductor layer of a first conductivity type formed above the rectification section, an active layer formed above the second semiconductor layer and a third semiconductor layer of a second conductivity type formed above the active layer, wherein the rectification section and the emission section are electrically connected in parallel with each other, and the rectification section has a rectification action in a reverse direction with respect to the emission section.

12 Claims, 6 Drawing Sheets

SURFACE EMITTING TYPE DEVICE, AND METHOD FOR MANUFACTURING THE SAME

The entire disclosure of Japanese Patent Application No. 2005-029232, filed Feb. 4, 2005 is expressly incorporated by reference herein.

BACKGROUND

1. Technical Field

The present invention relates to surface-emitting type devices and methods for manufacturing the same.

2. Related Art

A surface-emitting type semiconductor laser has a smaller device volume compared to an ordinary edge-emitting type semiconductor laser, such that the electrostatic breakdown voltage of the device itself is low. For this reason, the device may be damaged by static electricity caused by a machine or an operator in a mounting process. In particular, a surface-emitting type device such as a surface-emitting type semiconductor laser has a certain tolerance to a forward bias voltage, but has a low tolerance to a reverse bias voltage, and the device may be destroyed when a reverse bias voltage is impressed. A variety of measures are usually implemented in a mounting process to remove static electricity, but these measures have limitations. For example, JP-A-2004-6548 is an example of related art.

SUMMARY

In accordance with an advantage of some aspects of the invention, electrostatic destruction can be prevented and reliability can be improved with respect to surface-emitting type devices and methods for manufacturing the same.

In accordance with an embodiment of the invention, a surface-emitting type device has a rectification section including a substrate and a first semiconductor layer formed above the substrate, and an emission section including a second semiconductor layer of a first conductivity type formed above the rectification section, an active layer formed above the second semiconductor layer and a third semiconductor layer of a second conductivity type formed above the active layer, wherein the rectification section and the emission section are electrically connected in parallel with each other, and the rectification section has a rectification action in a reverse direction with respect to the emission section.

According to the surface-emitting type device, even when a reverse bias voltage is impressed to the emission section, a current flows in the rectification section that is connected in parallel with the emission section. By this, the electrostatic breakdown voltage of the surface-emitting type device to a reverse bias voltage can be considerably improved. Accordingly, destruction of the device by static electricity in a mounting process or the like can be prevented, such that its handling can be well facilitated, and its reliability can be improved.

It is noted that, in the embodiments of the invention, another specific element (hereafter referred to as "B") that is formed above a specific element (hereafter referred to as "A"), includes B that is formed directly on A, and B that is formed above A through another element on A. Also, in the invention, forming B above A includes a case of forming B directly on A, and a case of forming B above A through another element on A.

Also, in the embodiments of the invention, a "light absorbing layer" refers to a concept including a depletion layer.

In accordance with an aspect of the embodiment, the surface-emitting type device may have an optical detection section including the substrate, a light absorbing layer formed above the substrate, and a contact layer formed above the light absorbing layer.

In accordance with an aspect of the embodiment, the surface-emitting type device may include a substrate connecting electrode that is electrically connected to the substrate, and first, second and third electrodes that are electrically connected to the first, second and third semiconductor layers, respectively, wherein the substrate may have a first conductivity type, the first semiconductor layer may have a second conductivity type, the substrate connecting electrode may be electrically connected to the third electrode, and the first electrode may be electrically connected to the second electrode.

In the surface-emitting type device in accordance with an aspect of the embodiment, the rectification section may have a fourth semiconductor layer formed between the substrate and the first semiconductor layer.

In accordance with an aspect of the embodiment, the surface-emitting type device may have first, second, third and fourth electrodes that are electrically connected to the first, second, third and fourth semiconductor layers, respectively, wherein the first semiconductor layer may have a second conductivity type, the fourth semiconductor layer may have a first conductivity type, the first electrode may be electrically connected to the second electrode, and the third electrode may be electrically connected to the fourth electrode.

In accordance with an aspect of the embodiment, the surface-emitting type device may have an optical detection section including the substrate, a light absorbing layer formed above the substrate, and a contact layer formed above the light absorbing layer, wherein the optical detection section may have another contact layer formed between the substrate and the light absorbing layer, the contact layer and the first semiconductor layer may be formed by the same process, and the other contact layer and the fourth semiconductor layer are formed by the same process.

In the surface-emitting type device in accordance with an aspect of the embodiment, a capacitance adjusting layer may be formed between the substrate and the first semiconductor layer.

In the surface-emitting type device in accordance with an aspect of the embodiment, the emission section may be formed vertically above at least a portion of the rectification section.

In the surface-emitting type device in accordance with an aspect of the embodiment, the emission section may function as a surface-emitting type semiconductor laser, and the second semiconductor layer and the third semiconductor layer may be mirrors.

In the surface-emitting type device in accordance with an aspect of the embodiment, the emission section may function as a surface-emitting type semiconductor laser, the second semiconductor layer and the third semiconductor layer may be mirrors, the optical detection section may function as a photodiode for monitoring the surface-emitting type semiconductor laser, and a lens section may be formed above the contact layer.

In accordance with an embodiment of the invention, a method for manufacturing a surface-emitting type device includes the steps of forming a semiconductor multilayer film, including forming a first semiconductor layer above a substrate, forming a second semiconductor layer of a first conductivity type above the first semiconductor layer, forming an active layer above the second semiconductor layer, and forming a third semiconductor layer of a second conductivity type above the active layer, and patterning the semiconductor multilayer film to form a rectification section including the substrate and the first semiconductor layer, and an emission section including the second semiconductor layer, the active layer and the third semiconductor layer, wherein the rectification section and the emission section are arranged to be electrically connected in parallel with each other, and the rectification section is formed to have a rectification action in a reverse direction with respect to the emission section.

In the method for manufacturing a surface-emitting type device in accordance with an aspect of the embodiment of the invention, a contact layer may be formed by the same step conducted for forming the first semiconductor layer in the step of forming the semiconductor multilayer film, the step of forming the semiconductor multilayer film may include forming a light absorbing layer above the substrate before the step of forming the contact layer, and the step of patterning the semiconductor multilayer film may be conducted to form an optical detection section including the substrate, the light absorbing layer and the contact layer.

In the method for manufacturing a surface-emitting type device in accordance with an aspect of the embodiment of the invention, the step of forming the semiconductor multilayer film may include forming a fourth semiconductor layer above the substrate before the step of forming the first semiconductor layer, and the step of patterning the semiconductor multilayer film may be conducted to form the rectification section that has the fourth semiconductor layer.

In the method for manufacturing a surface-emitting type device in accordance with an aspect of the embodiment of the invention, a contact layer may be formed by the same step conducted for forming the first semiconductor layer and another contact layer may be formed by the same step conducted for forming the fourth semiconductor layer in the step of forming the semiconductor multilayer film, the step of forming the semiconductor multilayer film may include forming a light absorbing layer above the other contact layer before the step of forming the contact layer, and the step of patterning the semiconductor multilayer film may be conducted to form an optical detection section including the contact layer, the light absorbing layer and the other contact layer.

DESCRIPTION OF EXEMPLARY EMBODIMENTS

Preferred embodiments of the invention are described below with reference to the accompanying drawings.

1. First Embodiment 1-1. First a surface-emitting type device 100 in accordance with a first embodiment is described.

Figure 1:
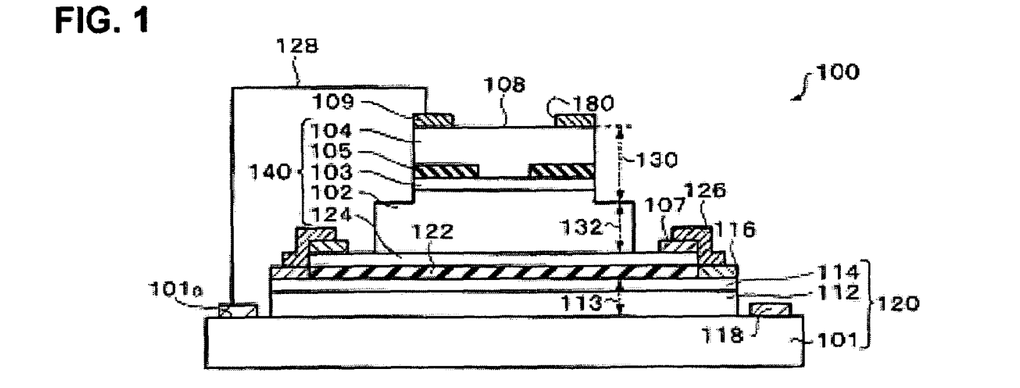
FIG. 1 is a cross-sectional view schematically showing a surface-emitting type device in accordance with a first embodiment of the invention.
Figure 2:
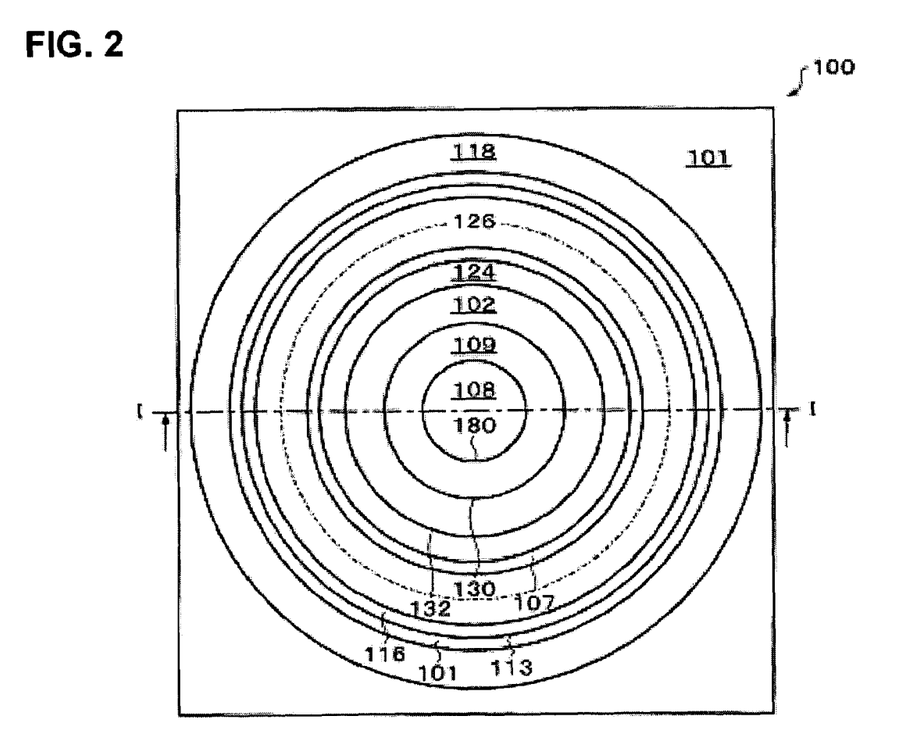
FIG. 2 is a plan view schematically showing the surface-emitting type device in accordance with the first embodiment of the invention.
Figure 3:
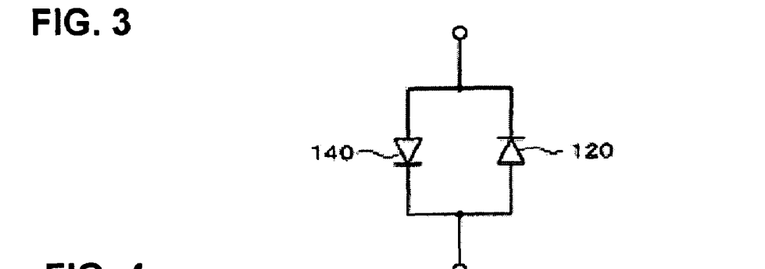
FIG. 3 is a circuit diagram of the surface-emitting type device in accordance with the first embodiment.

FIG. 1 is a cross-sectional view taken along a line I-I of FIG. 2, and FIG. 2 is a plan view schematically showing the surface-emitting type device 100. FIG. 3 is a circuit diagram of the surface-emitting type device 100.

The surface-emitting type device 100 includes, as shown in FIG. 1 and FIG. 2, a rectification section 120 and an emission section 140. The present embodiment is described as to a case in which the rectification section 120 functions as a junction diode (including a Zener diode) and the emission section 140 functions as a surface-emitting type semiconductor laser.

The rectification section 120 includes a substrate 101, a capacitance adjusting layer 112 formed above the substrate 101, and a first semiconductor layer 114 formed above the capacitance adjusting layer 112. The rectification section 120 has a rectification function. For example, a GaAs substrate of a first conductivity type (for example, n-type) can be used as the substrate 101. The substrate 101 supports the rectification section 120 and the emission section 140. In other words, the rectification section 120 and the emission section 140 are formed on the same substrate (on the same chip), and form a monolithic structure.

The capacitance adjusting layer 112 may be formed from, for example, a GaAs layer that is not doped with an impurity, and the first semiconductor layer 114 may be formed from a GaAs layer of, for example, a second conductivity type (for example, p-type). Accordingly, the p-type first semiconductor layer 114, the capacitance adjusting layer 112 that is not doped with an impurity and the n-type substrate 101 form a pin diode.

The capacitance adjusting layer 112 and the first semiconductor layer 114 form a columnar semiconductor deposited body (hereafter referred to as a "third columnar section") 113. The third columnar section 113 may have a plane configuration that is, for example, a circular shape, as shown in FIG. 2.

A substrate connecting electrode 118 is electrically connected to the substrate 101, and a first electrode 116 is electrically connected to the first semiconductor layer 114. For example, the substrate connecting electrode 118 is formed on an upper surface 101a of the substrate 101. The substrate connecting electrode 118 may have a plane configuration that is, for example, a ring shape shown in FIG. 2. For example, the first electrode 116 is formed on the first semiconductor layer 114, to the side of a capacitance reducing layer 122. The first electrode 116 may have a plane configuration that is, for example, a ring shape shown in FIG. 2. The substrate connecting electrode 118 and the first electrode 116 are used for driving the rectification section 120.

The capacitance reducing layer 122 is formed over the rectification section 120. The capacitance reducing layer 122 is provided between the rectification section 120 and the emission section 140. More concretely, as shown in FIG. 1, the capacitance reducing layer 122 is provided between the first semiconductor layer 114 and a third contact layer 124 to be described below. Because the capacitance reducing layer 122 is provided, a parasitic capacitance that is formed between the first semiconductor layer 114 and the third contact layer 124 can be reduced. As a result, the emission section 140 can be driven at high speed. The material, thickness and area of the capacitance reducing layer 122 can be decided according to the size of the parasitic capacitance. As the capacitance reducing layer 122, a $Al_{0.9}Ga_{0.1}As$ layer without being doped with an impurity or the like can be used. It is noted that the first electrode 116 is formed on the first semiconductor layer 114 in a region where the capacitance reducing layer 122 is not formed. Alternatively, the third contact layer 124 may be formed directly on the first semiconductor layer 114 without forming the capacitance reducing layer 122.

The emission section 140 is formed over the capacitance reducing layer 122. Also, the emission section 140 is formed vertically above at least a portion of the rectification section 120. In other words, in a plan view, the outer circumference of a lowermost layer (the third contact layer 124 in the present embodiment) among the emission section 140 is located inside (or coincides with) the outer circumference of an uppermost layer (the first semiconductor layer 114 in the present embodiment) among the rectification section 120. The emission section 140 includes the third contact layer 124 of a first conductivity type (for example, n-type), a second semiconductor layer 102 of the first conductivity type formed on the third contact layer 124, an active layer 103 formed on the second semiconductor layer 102, and a third semiconductor layer 104 of a second conductivity type (for example, p-type) formed on the active layer 103. More concretely, the third contact layer 124 is, for example, an n-type GaAs layer. The second semiconductor layer 102 is, for example, a distributed Bragg reflection type (DBR) mirror of 40 pairs of alternately laminated n-type $Al_{0.9}Ga_{0.1}As$ layers and n-type $Al_{0.15}Ga_{0.85}As$ layers. The active layer 103 has a multiple quantum well (MQW) structure in which quantum well structures each formed from, for example, a GaAs well layer and an $Al_{0.3}Ga_{0.7}As$ barrier layer are laminated in three layers. The third semiconductor layer 104 is, for example, a DBR mirror of 25 pairs of alternately laminated p-type $Al_{0.9}Ga_{0.1}As$ layers and p-type $Al_{0.15}Ga_{0.85}As$ layers. It is noted that the uppermost layer of the third semiconductor layer 104 may be a contact layer composed of, for example, a p-type GaAs layer. The composition of each of the layers and the number of the layers composing the second semiconductor layer 102, the active layer 103 and the third semiconductor layer 104 are not particularly limited. The p-type third semiconductor layer 104, the non-doped active layer 103 and the n-type second semiconductor layer 102 form a pin diode.

The third contact layer 124 and the capacitance reducing layer 122 described above form a columnar semiconductor deposited body. The columnar semiconductor deposited body has a plane configuration that is, for example, a circular shape. Also, a portion of the emission section 140 extending from the third semiconductor layer 104 to an intermediate point of the second semiconductor layer 102 composes a columnar semiconductor deposited body (hereafter referred to as a "first columnar section") 130, the remaining portion of the second semiconductor layer 102 composes another columnar semiconductor deposited body (hereafter referred to as a "second columnar section") 132. The first columnar section 130 has a plane configuration that is, for example, a circular shape shown in FIG. 2. The second columnar section 132 has a plane configuration that is, for example, a circular shape with a diameter greater than that of the circular shape of the first columnar section 130.

Also, the emission section 140 has an oxidized constricting layer 105. The oxidized constricting layer 105 may be, for example, one of the layers composing the third semiconductor layer 104. The oxidized constricting layer 105 is formed in a region near the active layer 103. As the oxidized constricting layer 105, for example, an oxidized AlGaAs layer can be used. The oxidized constricting layer 105 is a dielectric layer having an opening section. The oxidized constricting layer 105 is formed in a ring shape. More concretely, the oxidized constricting layer 105 is formed such that its cross-sectional shape, as being cut in a plane parallel with a surface 101a of the substrate 101 shown in FIG. 1, is a ring shape that is concentric with the circular shape of the plane configuration of the first columnar section 130.

A second electrode 107 is formed on an upper surface of the third contact layer 124. The second electrode 107 has a plane configuration that is, for example, a ring shape shown in FIG. 2. The second electrode 107 is electrically connected to the third contact layer 124. A third electrode 109 is formed on the first columnar section 130. The third electrode 109 has a plane configuration that is, for example, a ring shape shown in FIG. 2. The third electrode 109 is electrically connected to the third semiconductor layer 104. The third electrode 109 has an opening section 180 over the first columnar section 130. In other words, the opening section 180 forms a region in the upper surface of the third semiconductor layer 104 where the third electrode 109 is not provided. This region defines an emission surface 108 of laser light. The shape of the emission surface 108 may be, for example, a circular shape shown in FIG. 2.

In the surface-emitting type device 100 shown in FIG. 1 and FIG. 2, the second electrode 107 connects to the second semiconductor layer 102 through the third contact layer 124, and the third electrode 109 connects to the third semiconductor layer 104 on the first columnar section 130. A current is injected in the active layer 103 by the second electrode 107 and the third electrode 109.

The rectification section 120 and the emission section 140 are electrically connected in parallel with each other, and the rectification section 120 has a rectification function in a reverse direction with respect to the emission section 140. As a concrete connection configuration, for example, the first electrode 116 and the second electrode 107 may be electrically connected with each other by a first wiring 126, and the substrate connecting electrode 118 and the third electrode 109 may be electrically connected with each other by a second wiring 128. It is noted that the illustration of the second wiring 128 is simplified in FIG. 1, and omitted in FIG. 2.

When the emission section 140 is driven, a forward bias voltage is impressed to the emission section 140, and a reverse bias voltage is impressed to the rectification section 120. In this instance, the breakdown voltage of the rectification section 120 may preferably be greater than the drive voltage of the emission section 140, so as to flow a current only in the emission section 140. By this, even when a forward bias voltage is impressed to the emission section 140, no (or almost no) reverse current flows in the rectification section 120, such that the emission operation normally takes place at the emission section 140.

It is noted here that the breakdown voltage of the rectification section 120 can be optionally controlled by, for example, adjusting the composition, impurity concentration and the like of the substrate 101 and the first semiconductor layer 114. For example, by reducing the impurity concentration of the substrate 101 and the first semiconductor layer 114, the breakdown voltage of the rectification section 120 can be increased. The substrate 101 and the first semiconductor layer 114 are formed independently of semiconductor layers that contribute to the light emission action of the emission section 140. For this reason, the composition, impurity concentration and the like of the substrate 101 and the first semiconductor layer 114 can be freely adjusted. Accordingly, the rectification section 120 can be readily formed with more ideal characteristics, electrostatic destruction can be effectively prevented, and more stable emission operation can be achieved.

Alternatively, by adjusting the composition, impurity concentration and the like of the emission section 140 and the second and third semiconductor layers 102 and 104, the drive voltage of the emission section 140 can be made smaller than the breakdown voltage of the rectification section 120.

Also, by changing the film thickness of the capacitance adjusting layer 112, the capacitance of the rectification section 120 can be optionally changed and set to a desired value. For example, by reducing the film thickness of the capacitance adjusting layer 112, the capacitance of the rectification section 120 can be increased, and further, the breakdown voltage of the rectification section 120 can be increased.

It is noted that the invention is not limited to the case where the emission section 140 is a surface-emitting type semiconductor laser, but is also applicable to other surface-emitting type devices (such as, for example, semiconductor emission diodes, and organic LEDs). Also, the invention is not limited to the case where the rectification section 120 is a junction diode, but is also applicable to other rectification elements (such as, for example, Schottky diodes).

Figure 4:
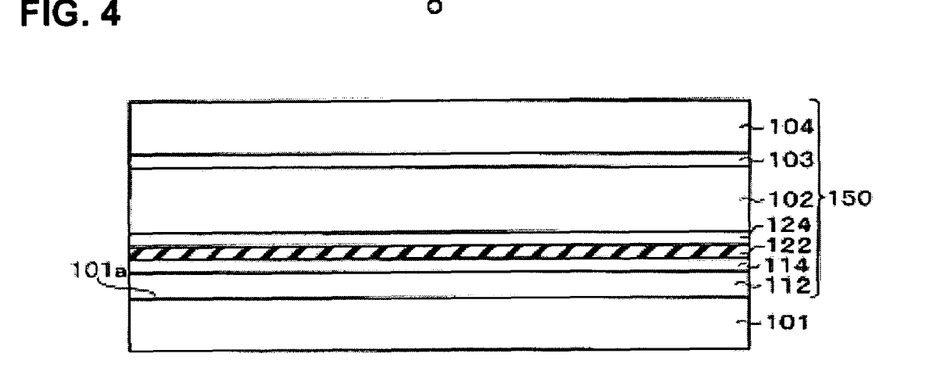
FIG. 4 is a cross-sectional view schematically showing a method for manufacturing the surface-emitting type device in accordance with the first embodiment.
Figure 5:
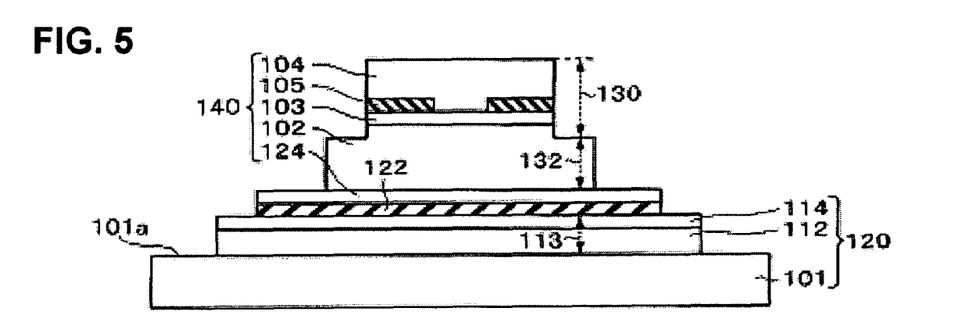
FIG. 5 is a cross-sectional view schematically showing the method for manufacturing the surface-emitting type device in accordance with the first embodiment.

1-2. Next, an example of a method for manufacturing the surface-emitting type device 100 in accordance with the present embodiment is described with reference to FIG. 1, FIG. 2, FIG. 4 and FIG. 5. FIG. 4 and FIG. 5 are cross-sectional views schematically showing a process for manufacturing the surface-emitting type device 100 in accordance with the present embodiment shown in FIG. 1 and FIG. 2, and correspond to the cross-sectional view shown in FIG. 1, respectively.

(1) First, as shown in FIG. 4, for example, an n-type GaAs substrate is prepared as a substrate 101.

Next, a semiconductor multilayer film 150 is formed on the substrate 101 by epitaxial growth while modifying its composition. The semiconductor multilayer film 150 is composed of successively laminated semiconductor layers that compose a capacitance adjusting layer 112, a first semiconductor layer 114, a capacitance reducing layer 122, a third contact layer 124, a second semiconductor layer 102, an active layer 103 and a third semiconductor layer 104. It is noted that, when the third semiconductor layer 104 is grown, at least one layer thereof near the active layer 103 is formed to be a layer that is later oxidized and becomes an oxidized constricting layer 105. As the layer that becomes to be the oxidized constricting layer 105, an AlGaAs layer with its Al composition being 0.95 or greater can be used. The Al composition of the AlGaAs layer means an aluminum composition with respect to III-group elements.

(2) Next, as shown in FIG. 5, the semiconductor multilayer film 150 is patterned to form the capacitance adjusting layer 112, the first semiconductor layer 114, the capacitance reducing layer 122, the third contact layer 124, the second semiconductor layer 102, the active layer 103 and the third semiconductor layer 104 in desired configurations. By this, first through third columnar sections 130, 132 and 113 are formed. The semiconductor multilayer film 150 can be patterned by known lithography technique and etching technique.

Next, by placing the substrate 101 on which the first through third columnar sections 130, 132 and 113 are formed through the aforementioned steps in a water vapor atmosphere at about 400° C., for example, the above-described layer that becomes to be an oxidized constricting layer 105 is oxidized from its side surface, thereby forming the oxidized constricting layer 105, as shown in FIG. 5. When the emission section 140 having the oxidized constricting layer 105, electrical current flows only in a portion where the oxidized constricting layer 105 is not formed (a portion that is not oxidized). Accordingly, in the process for forming the oxidized constricting layer 105, the range of the oxidized constricting layer 105 to be formed may be controlled, whereby the current density can be controlled.

(3) Next, as shown in FIG. 1 and FIG. 2, a substrate connecting electrode 118, first-third electrodes 116, 107 and 109, and first and second wirings 126 and 128 are formed. These electrodes and wirings may be formed by, for example, a combination of vacuum vapor deposition method and lift-off method. As the substrate connecting electrode 118 and the second electrode 107, for example, a laminated film of an alloy of gold (Au) and germanium (Ge), nickel (Ni) and gold (Au) can be used. As the first electrode 116 and the third electrode 109, for example, a laminated film of an alloy of gold (Au) and zinc (Zn), and gold (Au) can be used. As the first and second wirings 126 and 128, for example, gold (Au) can be used. It is noted that the order to form the electrodes and the wirings is not particularly limited.

By the steps described above, the surface-emitting type device 100 in accordance with the present embodiment can be obtained, as shown in FIG. 1 and FIG. 2.

Figure 6:
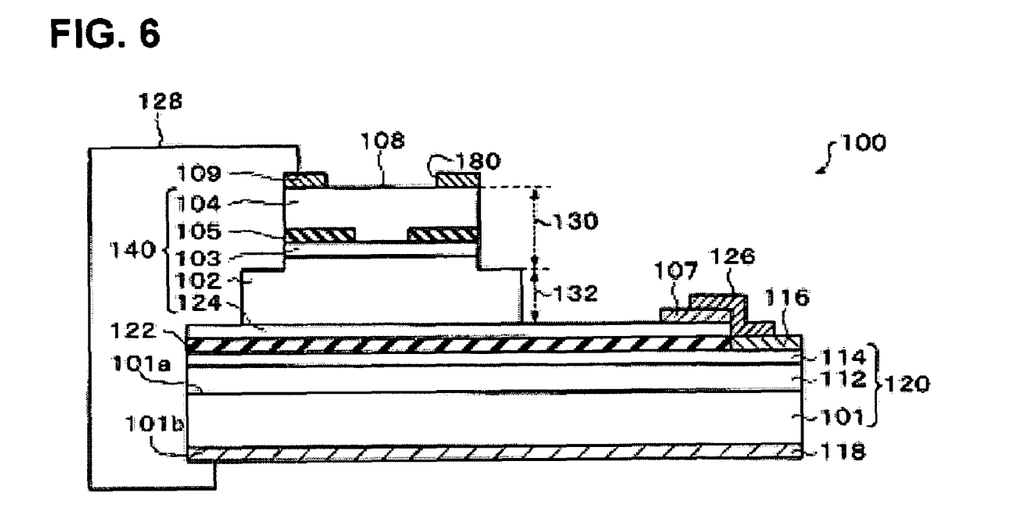
FIG. 6 is a cross-sectional view schematically showing a modified example of the surface-emitting type device in accordance with the first embodiment.
Figure 7:
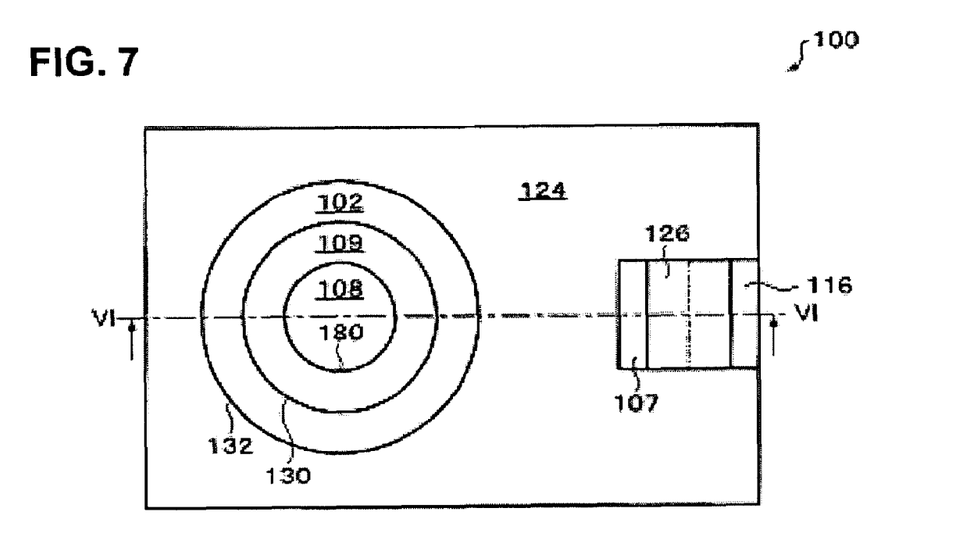
FIG. 7 is a plan view schematically showing the modified example of the surface-emitting type device in accordance with the first embodiment.

1-3. Next, a modified example of the surface-emitting type device 100 in accordance with an embodiment is described with reference to the drawings. It is noted that features different from the surface-emitting type device 100 described above and shown in FIG. 1 and FIG. 2 are described, and descriptions of similar features are omitted. FIG. 6 is a cross-sectional view taken along a line VI-VI of FIG. 7, and FIG. 7 is a plan view schematically showing an example of the modified example of the surface-emitting type device 100.

For example, as shown in FIG. 6, the substrate connecting electrode 118 can be formed over the entire surface of a back surface 101b of a substrate 101. It is noted that, in the surface-emitting type device 100 shown in FIG. 1 and FIG. 2, the first and second electrodes 116 and 107 and the first wiring 126 surround the second columnar section 132. However, as shown in FIG. 7, the first and second electrodes 116 and 107 and the first wiring 126 may be formed in a portion to the side of the second columnar section 132 without surrounding the second columnar section 132. The first and second electrodes 116 and 107 and the first wiring 126 may have a plane configuration that is, for example, a rectangular shape shown in FIG. 7.

It is noted that the modified example described above is an example, and the invention is not limited to this example.

1-4. According to the surface-emitting type device 100 in accordance with the present embodiment, even when a reverse bias voltage is impressed to the emission section 140, a current flows to the rectification section 120 that is connected in parallel with the emission section 140. By this, the electrostatic breakdown voltage of the surface-emitting type device 100 against a reverse bias voltage can be considerably improved. Accordingly, electrostatic destruction can be prevented in the mounting process or the like, such that its handling can be well facilitated, and its reliability can be improved.

Also, according to the surface-emitting type device 100 in accordance with the present embodiment, the emission section 140 is formed vertically above a portion of the rectification section 120. In other words, a part of the rectification section 120 is disposed immediately below the emission section 140. In other words, the space immediately below the emission section 140 can be effectively used. For example, as shown in FIG. 1 and FIG. 2, the rectification section 120 having an area in a plan view (hereafter referred to as a "plane area") that is about the same as a plane area of the emission section 140 can be provided below the emission section 140. As a result, for example, the plane area of the entire device can be made smaller, compared to the case where the rectification section 120 is formed to the side of the emission section 140. Also, in this case, the plane area of the entire surface-emitting type device 100 is about the same as the plane area of the emission section 140. Accordingly, the smaller the capacitance of the emission section 140 is made by reducing the plane area of the emission section 140 to drive the emission section 140 at higher speeds, the smaller the plane area of the entire surface-emitting type device 100 can be made. In other words, in accordance with the present embodiment, the plane area of the entire device can be made so as not to depend on the plane area of the rectification section 120.

Also, for example, as shown in FIG. 6 and FIG. 7, the plane area of the rectification section 120 can be freely made larger depending on the requirements, compared to the plane area of the emission section 140. By enlarging the plane area of the rectification section 120, its capacitance can be increased, and further its breakdown voltage can be increased. In this case also, the plane area of the emission section 140 can be freely made smaller depending on the requirements. By reducing the plane area of the emission section 140, its capacitance can be reduced, and further the emission section 140 can be driven at high speed.

2. Second Embodiment 2-1. Next, a surface-emitting type device 200 in accordance with a second embodiment is described. It is noted that features different from the surface-emitting type device 100 described above and shown in FIG. 1 and FIG. 2 are mainly described, and descriptions of similar features are omitted.

Figure 8:
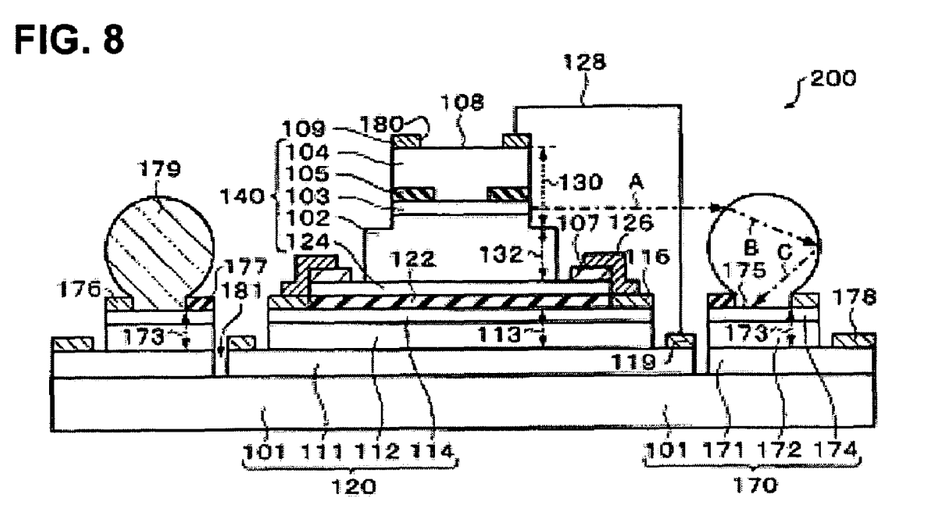
FIG. 8 is a cross-sectional view schematically showing a surface-emitting type device in accordance with a second embodiment of the invention.
Figure 9:
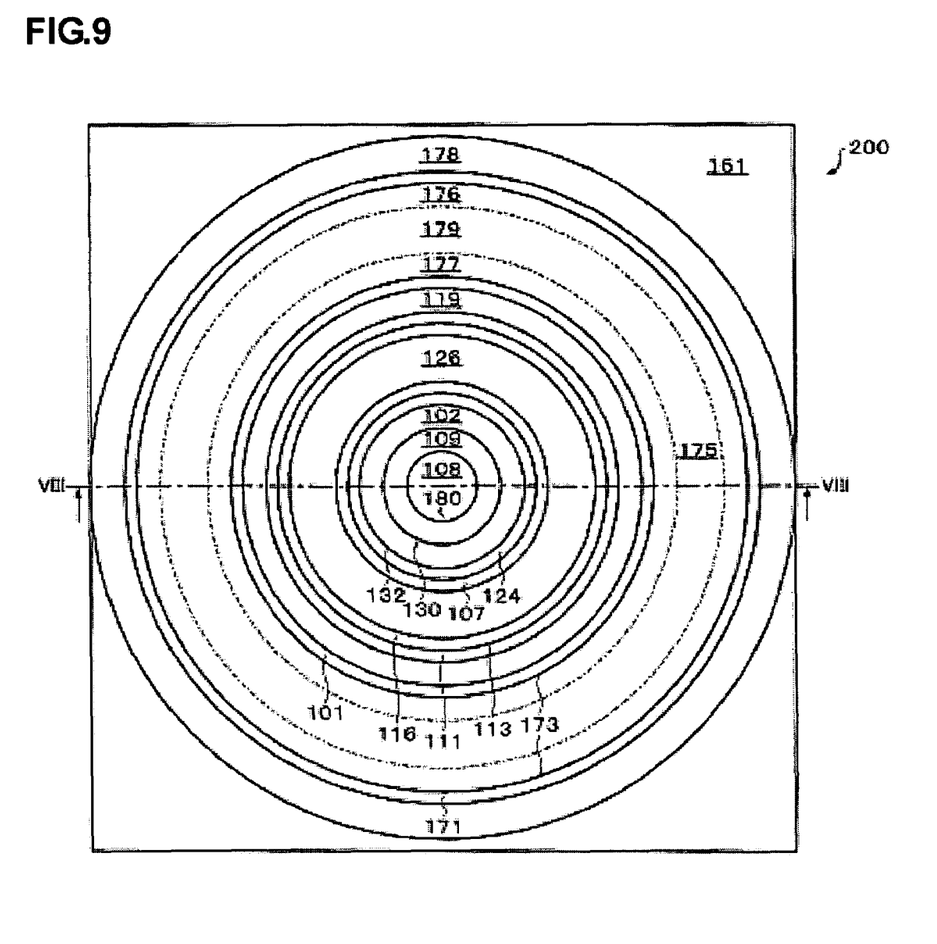
FIG. 9 is a plan view schematically showing the surface-emitting type device in accordance with the second embodiment of the invention.

FIG. 8 is a cross-sectional view taken along a line VIII-VIII of FIG. 9, and FIG. 9 is a plan view schematically showing the surface-emitting type device 200. It is noted that the same members as those of the surface-emitting type device 100 described above and shown in FIG. 1 and FIG. 2 are appended with the same reference numbers.

The surface-emitting type device 200 includes a rectification section 120, an emission section 140 and an optical detection section 170, as shown in FIG. 8 and FIG. 9. The present embodiment is described as to a case in which the rectification section 120 functions as a junction diode (including a Zener diode), the emission section 140 functions as a surface-emitting type semiconductor laser, and the optical detection section 170 functions as a photodiode.

The rectification section 120 includes a substrate 101, a fourth semiconductor layer 111 formed above the substrate 101, a capacitance adjusting layer 112 formed above the fourth semiconductor layer 111, and a first semiconductor layer 114 formed above the capacitance adjusting layer 112. As the substrate 101, for example, a semi-insulating GaAs substrate or the like can be used. The substrate 101 supports the rectification section 120, the emission section 140 and the optical detection section 170. In other words, the rectification section 120, the emission section 140 and the optical detection section 170 are formed on the same substrate (the same chip), and form a monolithic structure.

The fourth semiconductor layer 111 may be composed of, for example, a GaAs layer of a first conductivity type (for example, n-type). Accordingly, the p-type first semiconductor layer 114, the capacitance adjusting layer 112 that is not doped with an impurity, and the n-type fourth semiconductor layer 111 form a pin diode.

A fourth electrode 119 is electrically connected to the fourth semiconductor layer 111. For example, the fourth electrode 119 is formed on the fourth semiconductor layer 111. The fourth electrode 119 has a plane configuration that is, for example, a ring shape shown in FIG. 9. The fourth electrode 119 and the first electrode 116 are used to drive the rectification section 120.

The rectification section 120 and the emission section 140 are electrically connected in parallel with each other, and the rectification section 120 has a rectification function in a reverse direction with respect to the emission section 140. As a concrete connection configuration, for example, the first electrode 116 and the second electrode 107 may be electrically connected with each other by a first wiring 126, and the third electrode 109 and the fourth electrode 119 may be electrically connected with each other by a second wiring 128. It is noted that the illustration of the second wiring 128 is simplified in FIG. 8, and omitted in FIG. 9.

The optical detection section 170 includes the substrate 101, a second contact layer (the "other contact layer" described above) 171 formed above the substrate 101, a light absorbing layer 172 formed above the second contact layer 171, and a first contact layer (the "contact layer" described above) 174 formed above the light absorbing layer 172. The second contact layer 171 is formed by the same process conducted for forming the fourth semiconductor layer 111, the light absorbing layer 172 is formed by the same process conducted for forming the capacitance adjusting layer 112, and the first contact layer 174 is formed by the same process conducted for forming the first semiconductor layer 114. In other words, the second contact layer 171 is composed of semiconductor with the same composition as that of the fourth semiconductor layer 111, the light absorbing layer 172 is composed of semiconductor with the same composition as that of the capacitance adjusting layer 112, and the first contact layer 174 is composed of semiconductor with the same composition as that of the first semiconductor layer 114. Furthermore, the distance between the substrate 101 and the light absorbing layer 172 is about the same as the distance between the substrate 101 and the capacitance adjusting layer 112, and the distance between the substrate 101 and the first contact layer 174 is about the same as the distance between the substrate 101 and the first semiconductor layer 114.

More concretely, the second contact layer 171 may be composed of, for example, a GaAs layer of a first conductivity type (for example, n-type), the light absorbing layer 172 may be composed of, for example, a non-doped GaAs layer, and the first contact layer 174 may be composed of, for example, a GaAs layer of a second conductivity type (for example, p-type). Accordingly, the p-type first contact layer 174, the non-doped light absorbing layer 172 and the n-type second contact layer 171 form a pin diode.

The second contact layer 171 has a plane configuration that is, for example, a ring shape surrounding the fourth semiconductor layer 111. The first contact layer 174 and the light absorbing layer 172 form a columnar semiconductor deposited body (hereafter referred to as a "fourth columnar section") 173. The fourth columnar section 173 has a plane configuration that is, for example, a ring shape. An inner side surface of the fourth columnar section 173 is continuous with an inner side surface of the second contact layer 171.

A fifth electrode 176 is electrically connected to the first contact layer 174. A sixth electrode 178 is electrically connected to the second contact layer 171. For example, the fifth electrode 176 is formed on the first contact layer 174 along its circumference. The fifth electrode 176 has a plane configuration that is, for example, a ring shape shown in FIG. 9. For example, the sixth electrode 178 is formed on the second contact layer 171. The sixth electrode 178 has a plane configuration that is, for example, a ring shape shown in FIG. 9. The fifth and sixth electrodes 176 and 178 are used to drive the optical detection section 170.

A dam member 177 and a lens section 179 are formed on the first contact layer 174. For example, the dam member 177 is formed along the circumference of the first contact layer 174. The dam member 177 has a plane configuration that is, for example, a ring shape shown in FIG. 9. A region in the upper surface of the first contact layer 174 where the dam member 177 or the fifth electrode 176 is not formed is a light incident surface 175. The light incident surface 175 has a configuration that is, for example, a ring shape in a plan view shown in FIG. 9. It is noted that, when a light transmissive material is used as the dam member 177, the region where the dam member 177 is formed also acts as the light incident surface 175. Due to the fact that the dam member 177 is provided, the material of the lens section 179 is dammed up in the step of forming the lens section 179 such that the lens section 179 can be formed in a desired configuration. The lens section 179 may be formed at least on the light incident surface 175. The lens section 179 can have a configuration that is a convex shape shown in FIG. 8. As the lens section 179, ultraviolet setting type resin, thermosetting type resin or the like can be used. The lens section 179 causes light (indicated by an arrow A) that is emitted from the side surface of the active layer 103 to enter the light incident surface 175 of the optical detection section 170, as shown in FIG. 8. Its details are described below.

An element isolation region 181 is formed between the rectification section 120 and the emission section 140, and the optical detection section 170. More concretely, the element isolation region 181 can be a groove formed by, for example, a side surface of the fourth semiconductor layer 111, an upper surface of the substrate 101 and a side surface of the second contact layer 171. In other words, the groove may be dug to a depth that exposes at least the upper surface of the substrate 101. In this case, by using an insulating or semi-insulating substrate as the substrate 101, the rectification section 120 and the emission section 140 can be securely, electrically isolated from the optical detection section 170. The element isolation region 181 has a plane configuration that is, for example, a ring shape.

2-2. Next, an example of a method for manufacturing the surface-emitting type device 200 in accordance with the present embodiment is described with reference to FIG. 8-FIG. 11. It is noted that features different from the method for manufacturing the surface-emitting type device 100 described above and shown in FIG. 1 and FIG. 2 are mainly described, and descriptions of similar features are omitted.

Figure 10:
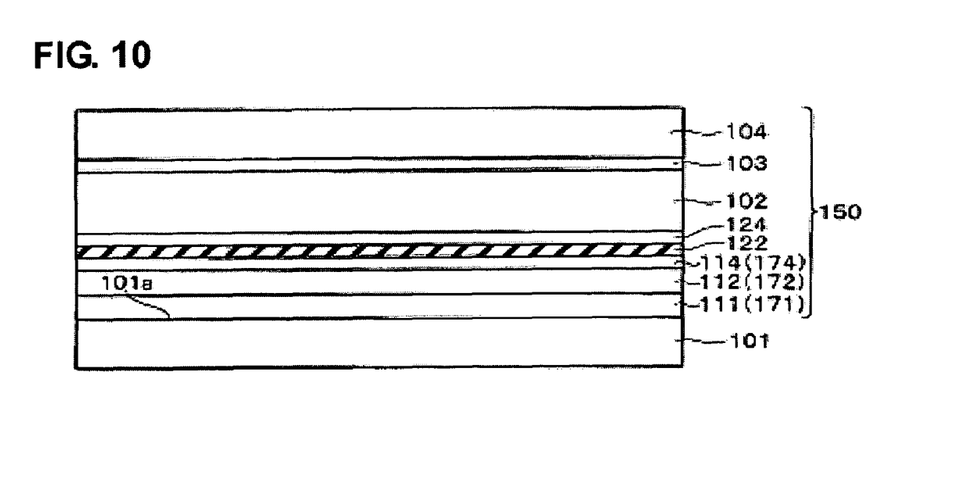
FIG. 10 is a cross-sectional view schematically showing a method for manufacturing the surface-emitting type device in accordance with the second embodiment.
Figure 11:
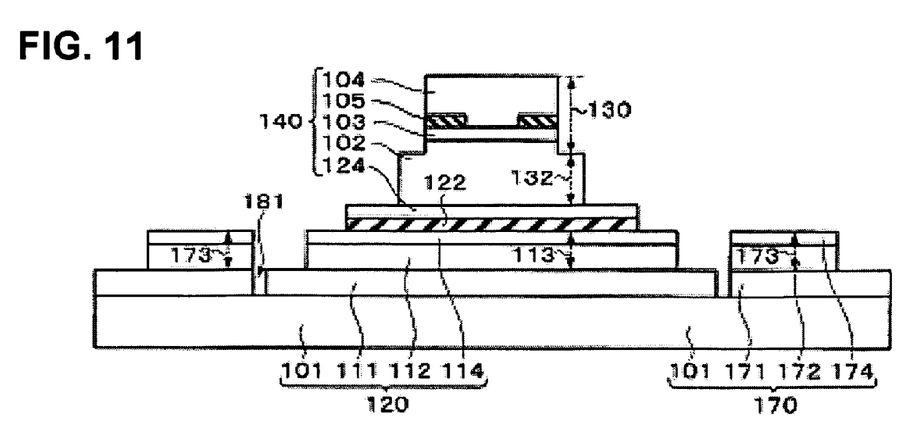
FIG. 11 is a cross-sectional view schematically showing the method for manufacturing the surface-emitting type device in accordance with the second embodiment.

FIG. 10 and FIG. 11 are cross-sectional views schematically showing a manufacturing process for manufacturing the surface-emitting type device 200 in accordance with the present embodiment shown in FIG. 8 and FIG. 9, and correspond to the cross-sectional view shown in FIG. 8, respectively.

First, as shown in FIG. 10, for example, a semi-insulating GaAs substrate is prepared as a substrate 101.

Next, a semiconductor multilayer film 150 is formed on the substrate 101 by epitaxial growth while modifying its composition. The semiconductor multilayer film 150 is composed of successively laminated semiconductor layers that compose a fourth semiconductor layer 111 (second contact layer 171), a capacitance adjusting layer 112 (light absorbing layer 172), a first semiconductor layer 114 (first contact layer 174), a capacitance reducing layer 122, a third contact layer 124, a second semiconductor layer 102, an active layer 103 and a third semiconductor layer 104. It is noted that the semiconductor layer that composes the fourth semiconductor layer 111 is also the semiconductor layer that composes the second contact layer 171, the semiconductor layer that composes the capacitance adjusting layer 112 is also the semiconductor layer that composes the light absorbing layer 172, and the semiconductor layer that composes the first semiconductor layer 114 is also the semiconductor layer that composes the first contact layer 174.

(2) Next, as shown in FIG. 11, the semiconductor multilayer film 150 is patterned to form the fourth semiconductor layer 111 and the second contact layer 171, the capacitance adjusting layer 112 and the light absorbing layer 172, the first semiconductor layer 114 and the first contact layer 174, the capacitance reducing layer 122, the third contact layer 124, the second semiconductor layer 102, the active layer 103 and the third semiconductor layer 104 in desired configurations. It is noted here that the fourth semiconductor layer 111 and the second contact layer 171 can be formed by the same patterning step, the capacitance adjusting layer 112 and the light absorbing layer 172 can be formed by the same patterning step, and the first semiconductor layer 114 and the first contact layer 174 can be formed by the same patterning step. Also, when the fourth semiconductor layer 111 and the second contact layer 171 are formed, an element isolation region 181 may be formed between them. Next, as shown in FIG. 11, an oxidized constricting layer 105 is formed.

(3) Next, as shown in FIG. 8 and FIG. 9, first-sixth electrodes 116, 107, 109, 119, 176 and 178, and first and second wirings 126 and 128 are formed. As the fourth and sixth electrodes 119 and 178, for example, a laminated film of an alloy of gold (Au) and germanium (Ge), nickel (Ni) and gold (Au) can be used. As the sixth electrode 176, for example, a laminated film of an alloy of gold (Au) and zinc (Zn), and gold (Au) can be used.

Next, as shown in FIG. 8 and FIG. 9, a dam member 177 is formed on the first contact layer 174. As the dam member 177, for example, resin such as polyimide, a dielectric layer such as SiN or the like can be used. The dam member 177 can be formed by a spin coat method, a CVD (Chemical Vapor Deposition) method or the like. The dam member 177 may be patterned by using, for example, known lithography technique and etching technique.

Next, as shown in FIG. 8 and FIG. 9, a lens section 179 is formed on at least a light incident surface 175. As shown in FIG. 8, the lens section 179 is formed to cause light (as indicated by an arrow A) emitted from a side surface of the active layer 103 to enter the incident surface 175 of the optical detection section 170. The lens section 179 may be formed by, for example, a dispenser method, an ink jet method or the like.

By the steps described above, the surface-emitting type device 200 in accordance with the present embodiment can be obtained, as shown in FIG. 8 and FIG. 9.

2-3. The surface-emitting type device 200 in accordance with the present embodiment has substantially the same actions and effects as the actions and effects described in the first embodiment.

Also, in the surface-emitting type device 200 in accordance with the present embodiment, as described above, the lens section 179 can cause light (as indicated by an arrow A) emitted from the side surface of the active layer 103 to enter the incident surface 175 of the optical detection section 170, as shown in FIG. 8. More concretely, the lens section 179 operates in the following manner.

In the emission section 140, when a forward bias voltage with respect to the pin diode is applied across the second and third electrodes 107 and 109, recombination of electrons and holes occur in the active layer 103, thereby causing emission of light due to the recombination. Stimulated emission occurs during the period the majority of generated light reciprocates between the second semiconductor layer 102 and the third semiconductor layer 104, whereby the light intensity is amplified. When the optical gain exceeds the optical loss, laser oscillation occurs, whereby laser light is emitted from the emission surface 108 in a direction orthogonal to the substrate 101. On the other hand, by adjusting the index of reflection at the side surface of the active layer 103 (to be smaller than 100%), a part of the light generated in the active layer 103 can be emitted from the side surface of the active layer 103. The index of reflection at the side surface of the active layer 103 can be adjusted by, for example, appropriately selecting the material that covers the side surface of the active layer 103. The light (indicated by an arrow A) emitted from the side surface of the active layer 103 is refracted at the lens section 179. The refracted light (indicated by an arrow B) is reflected at an outer circumferential surface of the lens section 179. The reflected light (indicated by an arrow C) enters the incident surface 175 of the optical detection section 170, as shown in FIG. 8. As a result, the optical detection section 170 can detect light emitted from the side surface of the active layer 103.

In other words, the optical detection section 170 in accordance with the present embodiment can monitor a part of light output of the emission section 140 that functions as a surface-emitting type semiconductor laser. In other words, the optical detection section 170 can function as a photodiode for monitoring the surface-emitting type semiconductor laser. By feeding back the monitored result to the driving circuit, changes in the output due to changes in temperature or the like can be corrected, such that stable light output can be obtained.

It is noted that the optical detection section 170 can also function as, for example, a reception photodiode in two-way optical communications. In this case, the optical detection section 170 can be made to function or not to function as a monitoring photodiode for the surface-emitting type semiconductor laser described above. When it does not function as a monitoring photodiode, the lens section 179 may not be formed.

Furthermore, according to the surface-emitting type device 200 and its manufacturing method in accordance with the present embodiment, the second contact layer 171 and the fourth semiconductor layer 111 can be formed by a common process, the light absorbing layer 172 and the capacitance adjusting layer 112 can be formed by a common process, and the first contact layer 174 and the first semiconductor layer 114 can be formed by a common process. Accordingly, when the rectification section 120, the emission section 140 and the optical detection section 170 are formed on the same substrate, the manufacturing process can be simplified. In other words, according to the surface-emitting type device 200 and its manufacturing method in accordance with the present embodiment, the rectification section 120, the emission section 140 and the optical detection section 170 can be readily integrated on a common substrate.

Also, according to the surface-emitting type device 200 in accordance with the present embodiment, the emission section 140 for transmission and the optical detection section 170 for reception in two-way communications can be formed on a common substrate, such that an alignment step for alignment with an optical waveguide (for example, an optical fiber or the like) that is used for optical communications can be simplified. As a result, the manufacturing cost can be reduced.

Although the embodiments of the invention are described above in detail, it should be readily understood by a person having ordinary skill in the art that many modifications can be made without departing in substance from the novelty and effects of the invention. Accordingly, such modified examples should be included in the scope of the invention.

For example, in the surface-emitting type devices 100 and 200 in accordance with the embodiments described above, the description is made as to the case where one first columnar section 130 is provided in the emission section 140. However, the mode of the invention shall not be harmed even when a plurality of first columnar sections 130 are provided in the emission section 140, or when the first columnar section 130 is not formed in the step of patterning the semiconductor multilayer film 150. Also, in the step of patterning the semiconductor multilayer film 150, the optical detection section 170 can be divided into a plurality of electrically isolated optical detection sections. Also, when a plurality of surface-emitting type devices 100 or 200 are formed in an array, similar actions and effects shall be exhibited. Furthermore, it should be noted that, for example, interchanging the p-type and n-type characteristics of each of the semiconductor layers in the above described embodiments does not deviate from the subject matter of the invention.

What is claimed is:

1. A surface-emitting type device comprising:
   a rectification section including a substrate and a first semiconductor layer formed above the substrate;
   a capacitance adjusting layer formed between the substrate and the first semiconductor layer; and
   an emission section including a second semiconductor layer of a first conductivity type formed above the rectification section, an active layer formed above the second semiconductor layer and a third semiconductor layer of a second conductivity type formed above the active layer,
   wherein the rectification section and the emission section are electrically connected in parallel with each other, and the rectification section has a rectification action in a reverse direction with respect to the emission section.

2. A surface-emitting type device according to claim 1, comprising an optical detection section including the substrate, a light absorbing layer formed above the substrate, and a contact layer formed above the light absorbing layer.

3. A surface-emitting type device comprising:
   a rectification section including a substrate and a first semiconductor layer formed above the substrate;
   an emission section including a second semiconductor layer of a first conductivity type formed above the rectification section, an active layer formed above the second semiconductor layer and a third semiconductor layer of a second conductivity type formed above the active layer; and
   a substrate connecting electrode that is electrically connected to the substrate, and first, second and third electrodes that are electrically connected to the first, second and third semiconductor layers, respectively, wherein the substrate has a first conductivity type, the first semiconductor layer has a second conductivity type, the substrate connecting electrode is electrically connected to the third electrode, and the first electrode is electrically connected to the second electrode,
   wherein the rectification section and the emission section are electrically connected in parallel with each other, and the rectification section has a rectification action in a reverse direction with respect to the emission section.

4. A surface-emitting type device comprising:
   a rectification section including a substrate and a first semiconductor layer formed above the substrate; and
   an emission section including a second semiconductor layer of a first conductivity type formed above the rectification section, an active layer formed above the second semiconductor layer and a third semiconductor layer of a second conductivity type formed above the active layer,
   wherein the rectification section and the emission section are electrically connected in parallel with each other, and the rectification section has a rectification action in a reverse direction with respect to the emission section,
   wherein the rectification section has a fourth semiconductor layer formed between the substrate and the first semiconductor layer.

5. A surface-emitting type device according to claim 4, comprising first, second, third and fourth electrodes that are electrically connected to the first, second, third and fourth semiconductor layers, respectively, wherein the first semiconductor layer has a second conductivity type, the fourth semiconductor layer has a first conductivity type, the first electrode is electrically connected to the second electrode, and the third electrode is electrically connected to the fourth electrode.

6. A surface-emitting type device according to claim 4, comprising an optical detection section including the substrate, a light absorbing layer formed above the substrate, and a contact layer formed above the light absorbing layer,
   wherein the optical detection section has another contact layer formed between the substrate and the light absorbing layer, the contact layer and the first semiconductor layer are formed by a common process, and the other contact layer and the fourth semiconductor layer are formed by a common process.

7. A surface-emitting type device according to claim 1, wherein the emission section is formed vertically above at least a portion of the rectification section.

8. A surface-emitting type device according to claim 1, wherein the emission section functions as a surface-emitting type semiconductor laser, and the second semiconductor layer and the third semiconductor layer are mirrors.

9. A surface-emitting type device according to claim 2, wherein the emission section functions as a surface-emitting type semiconductor laser, the second semiconductor layer and the third semiconductor layer are mirrors, the optical detection section functions as a photodiode for monitoring the surface-emitting type semiconductor laser, and a lens section is formed above the contact layer.

10. A method for manufacturing a surface-emitting type device, comprising the steps of:
    forming a semiconductor multilayer film, including forming a first semiconductor layer above a substrate, forming a second semiconductor layer of a first conductivity type above the first semiconductor layer, forming an active layer above the second semiconductor layer, and forming a third semiconductor layer of a second conductivity type above the active layer; and
    patterning the semiconductor multilayer film to form a rectification section including the substrate and the first semiconductor layer, and an emission section including the second semiconductor layer, the active layer and the third semiconductor layer,
    wherein the step of forming the semiconductor multilayer film includes forming a fourth semiconductor layer above the substrate before the step of forming the first semiconductor layer, and the step of patterning the semiconductor multilayer film is conducted to form the rectification section having the fourth semiconductor layer,
    wherein the rectification section and the emission section are arranged to be electrically connected in parallel with each other, and the rectification section is formed to have a rectification action in a reverse direction with respect to the emission section.

11. A method for manufacturing a surface-emitting type device, comprising the steps of:
    forming a semiconductor multilayer film, including forming a first semiconductor layer above a substrate, forming a second semiconductor layer of a first conductivity type above the first semiconductor layer, forming an active layer above the second semiconductor layer, and forming a third semiconductor layer of a second conductivity type above the active layer; and
    patterning the semiconductor multilayer film to form a rectification section including the substrate and the first semiconductor layer, and an emission section including the second semiconductor layer, the active layer and the third semiconductor layer, wherein a contact layer is formed by a common step for forming the first semiconductor layer in the step of forming the semiconductor multilayer film, the step of forming the semiconductor multilayer film includes forming a light absorbing layer above the substrate before the step of forming the contact layer, and the step of patterning the semiconductor multilayer film is conducted to form an optical detection section including the substrate, the light absorbing layer and the contact layer, wherein the rectification section and the emission section are arranged to be electrically connected in parallel with each other, and the rectification section is formed to have a rectification action in a reverse direction with respect to the emission section.

12. A method for manufacturing a surface-emitting type device according to claim 10, wherein a contact layer is formed by a common step for forming the first semiconductor layer and another contact layer is formed by a common step for forming the fourth semiconductor layer in the step of forming the semiconductor multilayer film, the step of forming the semiconductor multilayer film includes forming a light absorbing layer above the other contact layer before the step of forming the contact layer, and the step of patterning the semiconductor multilayer film is conducted to form an optical detection section including the contact layer, the light absorbing layer and the other contact layer.

* * * * *